United States Patent [19]

Oehrig et al.

[11] 4,322,708
[45] Mar. 30, 1982

[54] ELECTROMAGNETIC DEVICE UTILIZING A PAIR OF MAGNETICALLY ACTIVATED ELECTRONIC SWITCHES

[75] Inventors: Kenneth H. Oehrig, Plainfield; Frank J. Petkewicz, Chicago, both of Ill.

[73] Assignee: GTE Automatic Electric Labs Inc., Northlake, Ill.

[21] Appl. No.: 196,943

[22] Filed: Oct. 14, 1980

[51] Int. Cl.$^3$ .............................................. H01L 43/04
[52] U.S. Cl. ............................... 338/32 H; 323/368; 324/117 H; 335/298
[58] Field of Search .......................... 338/32 H, 32 R; 323/368; 357/27; 324/251, 252, 235, 117 H, 133; 329/200; 335/298; 307/278, 239, 309, 116

[56] References Cited

U.S. PATENT DOCUMENTS

| | | | |
|---|---|---|---|
| 3,369,206 | 2/1968 | Lundkvist | 335/258 X |
| 3,781,735 | 12/1973 | Haas | 335/298 |
| 4,218,626 | 8/1980 | Fukuda et al. | 338/32 A X |

*Primary Examiner*—C. L. Albritton
*Attorney, Agent, or Firm*—Robert J. Black; Anthony Miologos

[57] ABSTRACT

An electromagnetic device utilizing a pair of Hall effect switches for detecting the presence or absence of an electrical current of a first and a second value. The device includes a flux generator for generating a field of magnetic flux and a magnetic circuit including a pair of adjustable cores for varying the amount of flux delivered to the Hall switches. A first Hall switch outputs a signal responsive to the presence or absence of a current of a first value and the second a signal representative of a current of a second value.

18 Claims, 7 Drawing Figures

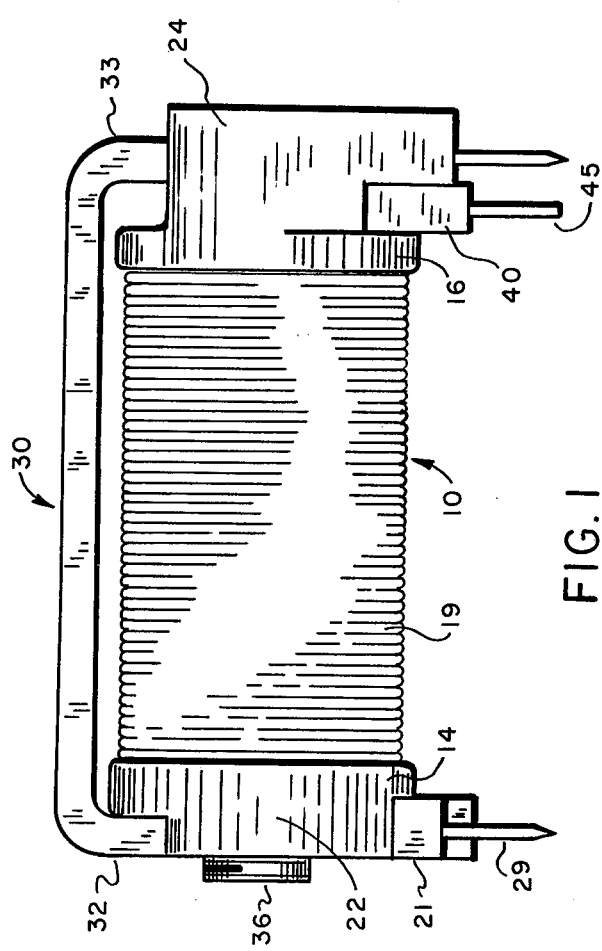

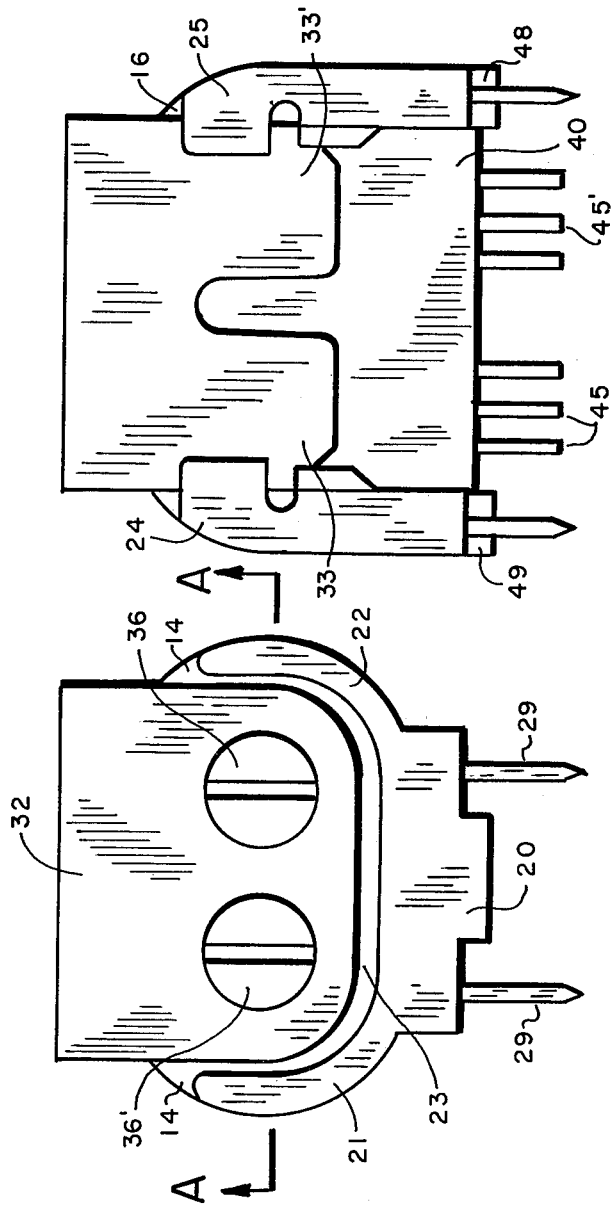

ELECTROMAGNETIC DEVICE UTILIZING A PAIR OF MAGNETICALLY ACTIVATED ELECTRONIC SWITCHES

BACKGROUND OF THE INVENTION (1) Field of the Invention

The present invention relates in general to electromagnetic switches and more particularly to an electromagnetic device used to control the operate and release characteristics of a magnetically activated electronic switch.

(2) Description of the Prior Art

Magnetically activated electronic switches or "Hall effect" digital switches utilize the Hall effect for sensing a magnetic field. That is, a Hall cell included in the switch senses a magnetic field and provides electrical outputs corresponding to the presence of absence of a magnetic flux. Such a Hall effect switch is the Sprague ULS-3006T which other than the Hall cell, includes an amplifier, trigger and output stages integrated into a single monolithic chip. These relatively inexpensive solid state devices are compact and highly reliable. Further, since switching is done without the need of contacts they are not prone to contact bounce and thus are well suited in digital electronic applications.

Operationally these switches are configured in either a normally "off" or a normally "on" configuration. In the normally "off" configuration an output transistor in the output stage of the switch is normally off when the magnetic field perpendicular to the surface of the Hall cell is below a threshold or "operate point". When the field exceeds the "operate point" the output transistor switches on and is capable of sinking a set amount of current. The output transistor switches off when the magnetic field is reduced below the "release point" which is less then the "operate point". The normally "on" devices output transistor sinks current and is on when the magnetic field is below the threshold or "operate point" and switches off when the field exceeds the "operating point". The hysteresis characteristics provide for unambiguous or non-oscillatory switching regardless of the rate of change of the magnetic field.

These devices are finding increased usage as sensor devices which can detect either a current or electrical potential and trigger a signal such as to a digital computer or to an alarm device. Such an application is described in U.S. Pat. No. 4,104,488 titled "Subscriber Line Circuit" to D. A. Weir et al., issued May 19, 1977. The Weir patent teaches Hall effect devices which are incorporated to detect line looping, dialing and ring-trip sensing in a telephone system.

A problem associated with the Hall effect switches is that the sensitivities or the operate and release thresholds of the devices vary from device to device.

This can be solved by purchasing a large number of devices, testing and using only those devices which fit certain circuit characteristics. Or on the other hand designing the circuit characteristics around a specific operate and release sensitivity and fiting the appropriate Hall switch to these characteristics. In any event, these methods are costly and wasteful in both material and engineering which ultimately would make a final product very expensive.

One method of solving this problem and therefore the object of this invention is to provide an electromagnetic device that is capable of varying the amount of magnetic flux delivered to the Hall effect switch in order to tailor the operate sensitivities of the Hall effect switch to the desired operate and a non-operate characteristics of the electromagnetic device.

SUMMARY OF THE INVENTION

The present invention is an electromagnetic device employing a magnetically activated electronic switch or Hall switch to detect the presence or absence of an electrical current and output a corresponding signal.

The device consists of a magnetic flux generator, a magnetic circuit including an adjustable core and a Hall switch.

The magnetic flux generator produces a field of magnetic flux in response to the presence of an electrical current which is transmitted to the Hall switch via the magnetic circuit. The Hall switch is mounted within an air gap formed by the magnetic circuit and adjacent to one end of the adjustable core. The core is disposed to be adjusted toward or away from the switch effectively increasing or decreasing the flux density delivered to the Hall switch. In this manner the operating characteristics of the device may be tailored to the sensitivity of Hall switch.

Depending upon the type of Hall switch used, i.e. "normally on", or "normally off", the Hall switch produces an output signal corresponding to the absence of a magnetic flux and conversely an output signal corresponding to the presence of a magnetic flux.

While the description of a single Hall switch device described above can be used in many applications the availability of Hall switches having various sensitivities can be also used to advantage.

In this case two Hall switches having different operating and release points are mounted on an electromagnetic device having a single flux generator and a magnetic circuit including two adjustable cores. Each Hall switch is situated adjacent a respective core in the same manner as a single Hall switch device. The first Hall switch for example may have an operating point lower than the second, where a current of a first value would activate the first Hall switch and produce an output signal and current of a second higher value activate the first and second Hall switches. Again the adjustable core would tailor the operating characteristics of the device to each of the sensitivities of the Hall switches.

Finally, the availability of the Hall switches in a "normally on" and "normally off" type can be used to advantage in the form of a relay device.

A contactless electromagnetic relay may be fashioned consisting of a single flux generator, two magnetic circuits and at least two Hall switches. The first switch would be a normally on device and the second a normally off. With no current applied the first Hall switch would output a signal corresponding to its on condition and the second device output a signal corresponding to its off condition. Applying a current would turn off the first device again outputting a corresponding off signal and turn on the second device outputting its on signal.

While describing the relay as having two Hall switches any number and type of switches may be employed for particular switching applications. For example, the relay may include three normally on Hall switch types and two normally off or any number of combinations.

BRIEF DESCRIPTION OF THE DRAWINGS

A better understanding of the invention may be had from the consideration of the following detailed description taken in conjunction with the accompanying drawings in which:

FIG. 1 is a side elevational view of an electromagnetic device utilizing a pair of magnetically activated electronic switches in accordance with the present invention described herein.

FIG. 2 is a front end elevational view of the assembled electromagnetic device.

FIG. 3 is a rear end elevational view of the assembled electromagnetic device.

DESCRIPTION OF THE PREFERRED EMBODIMENT

Figure 7:
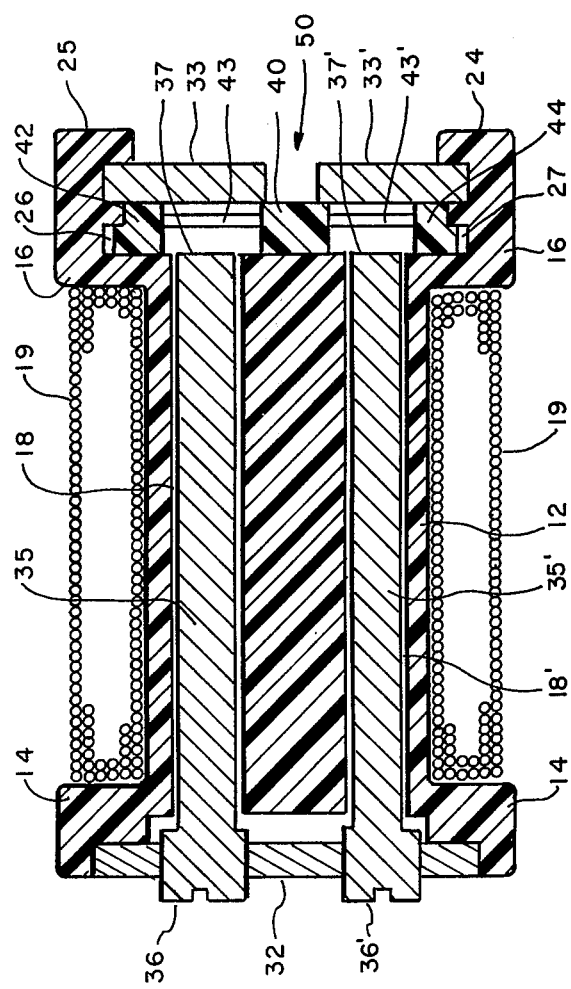
FIG. 7 is a sectional view taken substantially along line A—A of FIG. 2.

Turning now to FIGS. 1 and 7 the device of of the present invention includes a magnetic flux generator 10 having a molded bobbin of insulative material and comprised of a body portion 12 and flanges 14 and 16 on opposite ends of body 12. A coil of wire 19 is wound about the body portion intermediate flanges 14 and 16. Body portion 12 further includes a pair of longitudinally oriented bores 18 and 18' running through the body portion and both flanges 14 and 16. The exterior surface of flange 14 includes a U-shaped member 20 having arms 21 and 22 integrally molded to its surface forming a receiving area 23 between arms 21 and 22 as can be seen in FIG. 2. Turning now to FIG. 3, flange 16 includes a pair of L-shaped members 24 and 25 integrally molded and extending outward of an exterior surface of flange 16.

Terminal posts 29 extend from member 20 and are arranged to connect coil 19 to a source of electrical current allowing the flux generator to generate a magnetic field when current is applied.

Returning back to FIGS. 1 and 7, the device further includes a magnetic circuit comprised of a U-shaped return strap 30 composed of a suitable conductor material and a pair of ferromagnetic cores 35 and 35'. Cores 35 and 35' may be configured identically in width and length or in instances where a greater flux division is required may be of unequal width and/or length. A first leg 32 of return strap 30 is arranged to be held in receiving area 23 on flange 14. A second leg of return strap 30 is split into portions 33 and 33' which are held within a channel 50. The second leg of return strap 30 is split in order to easily channel magnetic flux at either Hall switch sensor. Channel 50 is formed by L-shaped arms 24 and 25 of flange 16. Leg 32 of return strap 30 includes a pair of threaded bores centrally located on the leg and arranged to accept a threaded end portion 36, 36' of ferromagnetic cores 35, 35' respectively. This allows cores 35 and 35' to be adjustably housed within bobbin bores 18, 18'.

An air gap is formed in the magnetic circuit between the core ends 37, 37' and legs 33, 33' respectively of return strap 30. The magnetic flux generated by coil 19 is transmitted by each respective core through the associated air gap and back to the cores via return strap 30.

It can be appreciated that by manually adjusting either core threaded portions 36 or 36' the distance between respective core ends 37, 37' and return strap legs 33, 33' can be increased or decreased and thus decreasing or increasing respectively the density of the flux transmitted through each air gap.

Figure 5:
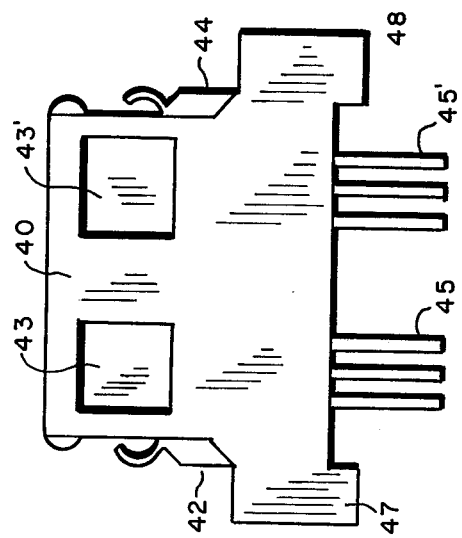
FIG. 5 is a rear elevational view of a magnetically activated electronic switch carrier in accordance with the present invention described herein.
Figure 6:
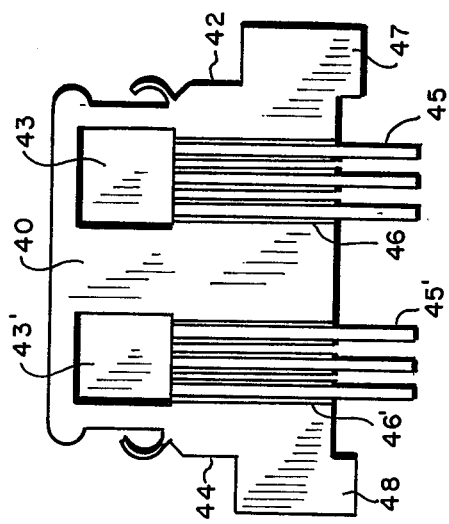
FIG. 6 is a front elevational view of the switch carrier.
Figure 4:
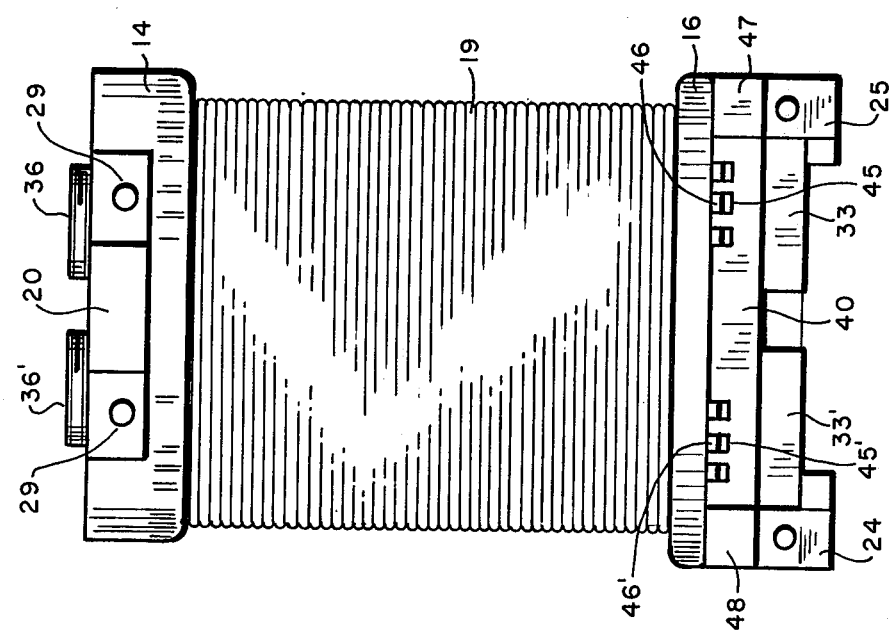
FIG. 4 is a bottom view of the assembled electromagnetic device.

The device is completed by a Hall switch carrier 40 illustrated in FIGS. 5 and 6 and comprised of a rectangular body portion including a pair of pockets 43, 43' each having a Hall switch situated therein. Guide arms 42 and 44 positioned on opposite ends of the carrier are arranged to be inserted into channels 26 and 27 formed in L-shaped members 24 and 25. Each guide arm 42 and 44 is inserted into a respective channel as seen on FIG. 7. Each guide arm further includes a deflectable finger portion arranged to be bent inward providing a friction fit between the carrier ends 42, 44 and channels 26 and 27. The carrier is configured to fit in the air gap between the exterior surface of flange 16 and the interior surface of legs 33, 33'. In this manner the Hall cell included in each of the Hall switches can be precisely positioned perpendicular to the magnetic flux flowing within a respective air gap. Carrier 40 further includes kerfs 46, 46' for extending terminals 45, 45' from respective Hall switches and allowing the Hall switches to be connected to exterior circuitry.

Turning now to FIG. 7 the operation of the device will be explained. With no electrical current applied to terminals 29, no magnetic field is generated by coil 19 and thus no magnetic flux flows through the magnetic circuit. Depending on the type of Hall effect switches installed, i.e. "normally on" or "normally off" a specific signal is generated and outputted via terminals 45, 45' representative of a no current condition. Because of the dual sensor configuration with separate flux control, multiple sensing of a progressive current may be accomplished. That is, each Hall switch would sense a specific value of current. For instance, the Hall switch associated with core 35 may have a turn on, or "operate point" lower than the "operate point" of the Hall switch associated with core 35'. A flux density of a first value produced by coil 19 and responsive to a current of a first value would turn on the Hall switch associated with core 35 and output a specific signal via terminals 45 representative of the current of a first value. The Hall effect switch associated with core 35' which would have a higher operate point would remain in an off condition. When a current of a second value is applied to terminals 29 of coil 19 a flux density representative of the second current value would be generated and applied to the magnetic circuit which would correspond to a second specific density sufficient to turn on the Hall effect switch associated with core 35'. At this time both Hall effect switches would be turned on, each outputting a specific signal via terminals 45 and 45' representative of the current of a second specific value.

Of course, the current values may be applied in the inverse. That is, when the higher current is applied both sensors are turned on outputting a signal and when the first current value or the lower current value is applied only one current sensor is on and the other off.

Since Hall switches each have operate and release characteristics which vary from device to device the adjustable core of the present invention is capable of varying the amount of magnetic flux delivered to each Hall switch. Threaded portions 36, 36' of cores 35, 35' respectively allow each core to be advanced toward each respective Hall switch or backed away from it. The closer the core portion 37, 37' is to the respective Hall switch the less ampere turns required to turn on the Hall element. In instances where a much greater flux division is required between the Hall switches one of the cores may be of a smaller width and length than the other. For example core 35' could have a length and/or width smaller than core 35 allowing a proportionally smaller flux density to be transmitted to the associated Hall switch for an applied current value. The position of each core is set during manufacture to get a proper match between the operate sensitivity of the Hall switches and the desired operate and non-operate characteristics of the assembled device. The adjustable cores may be also used to advantage to vary in flux rapidly in one core and slowly in the other, allowing for good control of flux division.

Different sensitivity Hall effect switches can be used such as the Sprague-3019 and 3020, to achieve extreme windows of coarse and fine sensing within a single coil.

The present invention has been described with reference to a specific embodiment thereof, for the purpose of illustrating the manner in which the invention may be used to advantage. It would be appreciated by those skilled in the art that the invention is not limited thereto. Accordingly, any and all modifications, variations, or equivalent arrangements which may occur to those skilled in the art should be considered to be within the scope of the invention.

What is claimed is:

1. An electromagnetic device arranged to produce a first and a second output signal responsive to an electrical current, said device comprising:

a magnetic flux generator including a tubular body portion and first and second axially spaced flanges extending perpendicularly from said body portion at opposite ends thereof, a pair of openings spaced equidistant and parallel to each other running through said body portion and each of said flanges and a coil of insulated wire wound about said body portion intermediate said flanges, said coil connected to said electrical current generating a field of magnetic flux;

a magnetic circuit including a pair of cores, each core slidably situated within a respective one of said bobbin openings and each core including a first end extending outward of said first flange and a second end proximate said second flange, a flux return path disposed adjacent said coil and including a first end portion mounted to said first flange and a second end portion arranged adjacent to and in spaced relationship with each one of said cores second end forming first and second air gaps therebetween, said flux return path further including adjusting means engaging each core first end to said flux return path first end portion and each core manually adjustable thereat, sliding each of said cores within a respective opening and providing a magnetic flux density of a first specific value within said first air gap and a magnetic flux density of a second specific value within said second air gap; and a pair of magnetic switching devices each mounted within a different one of said air gaps adjacent a respective core second end;

whereby, in response to a magnetic flux density of said first specific value said respective switching device is operated producing said first output signal and in response to a magnetic flux density of said second specific value said respective switching device is operated producing said second output signal.

2. An electromagnetic device as claimed in claim 1, wherein: each of said pair of cores is composed of a shaft of ferromagnetic material and each of said first ends include a threaded portion.

3. An electromagnetic device as claimed in claim 2, wherein: said flux return path is composed of a magnetically conductive material and said adjusting means comprises a pair of threaded bores on said first end portion, each threaded bore arranged to accept a respective core threaded portion therein and each of said cores arranged to rotate in a first or alternatively a second direction.

4. An electromagnetic device as claimed in claim 3, wherein: one of said cores is rotated in said first direction increasing the distance between said core second end and said flux return path second end portion, decreasing said flux density within said respective air gap.

5. An electromagnetic device as claimed in claim 3, wherein: another one of said cores is rotated in said second direction decreasing the distance between said core second end and said flux return path second end portion increasing said flux density within said respective air gap.

6. An electromagnetic device as claimed in claim 1, wherein: said magnetic switching devices are Hall effect switches.

7. An adjustable flux generator arranged to produce a magnetic flux of a first and second specific density responsive to an electrical current of a first and second specific value and including a pair of Hall effect switches each operable to produce a respective output signal responsive to said first and second magnetic flux density, said adjustable flux generator comprising:

a bobbin, including first and second axially spaced flanges extending perpendicularly from opposite ends of said bobbin, said bobbin further including a pair bores spaced equidistant and parallel to each other running longitudinally through said bobbin and said flanges and a coil of insulated wire wound about said bobbin intermediate said flanges, said coil connected to said electrical current generating a field of magnetic flux;

first and second cores, each slidably situated within a respective one of said pair of bores and each including a first threaded end extending outward of said first flange and a second end proximate said second flange;

a flux return path disposed adjacent said coil and including first and second end portions, said first end portion including a pair of threaded apertures and said first end portion mounted to said first flange with each core threaded first and engaging a respective threaded aperture and said flux return path second end portion arranged adjacent and in spaced relationship to said core second ends forming first and second air gaps therebetween;

a removable carrier frame having said pair of Hall effect switches mounted thereat, said frame placed within said first and second air gaps adjacent said flux return path second end portion with each of said pair of Hall effect switches adjacent to a respective one of said first and second core second ends;

whereby in response to said electrical current of said first specific value said first core first end is manually adjusted providing magnetic flux of said first specific density within said first air gap operating said respective Hall switch and producing an output signal and in response to said electrical current of said second specific value said second core first end is manually adjusted providing a magnetic flux of a second specific density within said second air gap operating said respective Hall switch and producing an output signal.

8. An adjustable flux generator as claimed in claim 7, wherein: said first flange includes a longitudinal channel on an exterior surface thereof opposite said coil, said channel arranged to contain said flux return path first end portion thereat.

9. An adjustable flux generator as claimed in claim 7, wherein: said second flange includes a pair of longitudinally oriented carrier channels on an exterior surface thereof opposite said coil, said carrier channels arranged parallel and in spaced relationship to each other and disposed to slidably accept said carrier frame therebetween.

10. An adjustable flux generator as claimed in claim 9, wherein: said second flange further includes a pair of L-shaped arms each extending outward of said exterior surface of said second flange forming a rectangular passage therebetween parallel to said carrier channels and arranged to contain said flux return path second end thereat.

11. An adjustable flux generator as claimed in claim 9, wherein: said carrier frame includes left and right surfaces and each of said surfaces include a guide member and at least one arcuately formed finger, each guide member and finger disposed to slidably insert into a different one of said carrier channels with said guide members positioning said carrier frame to said second flange and each of said fingers engaged to a respective carrier channel, frictionally holding said carrier frame to said channels.

12. An adjustable flux generator as claimed in claim 7, wherein: each of said first and second cores is comprised of a shaft of ferromagnetic material and said flux return path is composed of a magnetically conductive material and each core is arranged to rotate at said threaded end in a first direction and alternatively a second direction.

13. An adjustable flux generator as claimed in claim 12, wherein: said first core is rotated in said first direction sliding said core within said respective bore toward said respective Hall effect switch decreasing said first air gap and increasing said flux density.

14. An adjustable flux generator as claimed in claim 12, wherein: said second core is rotated in said first direction sliding said second core within said respective bore toward said respective Hall effect switch decreasing said second air gap and increasing said flux density.

15. An adjustable flux generator as claimed in claim 12, wherein: said first core is rotated in said second and opposite direction sliding said first core within said respective bore away from said respective Hall effect switch increasing said first air gap and decreasing said flux density.

16. An adjustable flux generator as claimed in claim 12, wherein: said second core is rotated in said second and opposite direction sliding said second core within said respective bore away from said respective Hall effect switch increasing said second air gap and decreasing said flux density.

17. An adjustable flux generator as claimed in claim 12, wherein: one of said first and second cores is smaller in width than the other providing a magnetic flux density smaller in proportion to the other.

18. An adjustable flux generator as claimed in claim 12, wherein: one of said first and second cores is smaller in length than the other providing a magnetic flux density smaller in proportion to the other.

* * * * *